(12) United States Patent
Lu et al.

(10) Patent No.: US 12,311,497 B1
(45) Date of Patent: May 27, 2025

(54) METHOD FOR CHEMICAL MECHANICAL POLISHING OF A SiC WAFER BASED ON A MAGNETORHEOLOGICAL ELASTIC METAL CONTACT CORROSION POLISHING PAD

(71) Applicant: GUANGDONG UNIVERSITY OF TECHNOLOGY, Guangzhou (CN)

(72) Inventors: Jiabin Lu, Guangzhou (CN); Da Hu, Guangzhou (CN); Zengquan Hu, Guangzhou (CN); Wenrui Liang, Guangzhou (CN); Zirong Huang, Guangzhou (CN); Haotian Long, Guangzhou (CN)

(73) Assignee: GUANGDONG UNIVERSITY OF TECHNOLOGY, Guangzhou (CN)

( * ) Notice: Subject to any disclaimer, the term of this patent is extended or adjusted under 35 U.S.C. 154(b) by 0 days.

(21) Appl. No.: 18/986,067

(22) Filed: Dec. 18, 2024

(30) Foreign Application Priority Data

Dec. 29, 2023 (CN) .......................... 202311873185.2

(51) Int. Cl.
*B24B 37/24* (2012.01)
*H01L 21/04* (2006.01)
*H01L 21/306* (2006.01)

(52) U.S. Cl.
CPC .......... *B24B 37/24* (2013.01); *H01L 21/0445* (2013.01); *H01L 21/30625* (2013.01)

(58) Field of Classification Search
None
See application file for complete search history.

(56) References Cited

U.S. PATENT DOCUMENTS

| 11,472,984 B1 | 10/2022 | Guo |
| 2018/0216240 A1 | 8/2018 | Ho et al. |

FOREIGN PATENT DOCUMENTS

| CN | 101870851 A | 10/2010 |
| CN | 103252710 A | 8/2013 |
| CN | 104149023 A | 11/2014 |
| CN | 113770816 A | 12/2021 |
| CN | 114559302 A | 5/2022 |
| CN | 115194564 A | 10/2022 |
| CN | 116833900 A | 10/2023 |

OTHER PUBLICATIONS

Hu Da, Preparation and Polishing Characteristics of Magnetorheological Elastic Polishing Pad for Single-Crystal SiC, Master's thesis, Jan. 15, 2023.

*Primary Examiner* — Stephanie P Duclair

(57) ABSTRACT

A method for chemical mechanical polishing of a SiC wafer based on a magnetorheological elastic metal contact corrosion polishing pad, including following steps of: attaching a magnetorheological elastic metal contact corrosion polishing pad to a polishing disk adding an electrolyte solution onto the magnetorheological elastic metal contact corrosion polishing pad; wherein the electrolyte solution is non-corrosive, the electrolyte solution is added between the SiC wafer and the magnetorheological elastic metal contact corrosion polishing pad; applying a polishing magnetic field to the magnetorheological elastic metal contact corrosion polishing pad to control the contact state of the abrasive and metal powders on the SiC wafer; to achieve a control over a chemical reaction intensity of the metal powders on a SiC wafer surface in the electrolyte solution, and to achieve a mechanical removal of materials from the SiC wafer surface via the abrasive.

5 Claims, 4 Drawing Sheets

Attaching a magnetorheological elastic metal contact corrosion polishing pad to a polishing disk, leading a SiC wafer and the magnetorheological elastic metal contact corrosion polishing pad to contact and move relative to each other /SS1

Adding an electrolyte solution with a concentration of 0.5 to 5 mol/L onto the magnetorheological elastic metal contact corrosion polishing pad; wherein the electrolyte solution is non-corrosive, the electrolyte solution is added between the SiC wafer and the magnetorheological elastic metal contact corrosion polishing pad /SS2

Applying a polishing magnetic field to the magnetorheological elastic metal contact corrosion polishing pad to control the contact state of the abrasives and metal powders on the SiC wafer /SS3

METHOD FOR CHEMICAL MECHANICAL POLISHING OF A SiC WAFER BASED ON A MAGNETORHEOLOGICAL ELASTIC METAL CONTACT CORROSION POLISHING PAD

CROSS REFERENCE TO RELATED APPLICATIONS

This application claims foreign priority of Chinese Patent Application No. 202311873185.2, filed on Dec. 19, 2023 in the China National Intellectual Property Administration, the disclosures of all of which are hereby incorporated by reference

TECHNICAL FIELD

The present disclosure relates to the technical field of polymer materials and ultra-precision polishing technology, in particular to a method for chemical mechanical polishing of a SiC wafer based on a magnetorheological elastic metal contact corrosion polishing pad and an application thereof.

BACKGROUND

For third-generation semiconductor SiC wafer, various ultra-precision polishing methods have been proposed to achieve efficient and high-quality processed surfaces. Chemical mechanical polishing (CMP) is considered one of the most effective techniques for flattening SiC wafer and is crucial for ensuring ultra-smooth, defect-free, and damage-free surfaces. CMP utilizes chemical reactions to form a surface softening layer with lower hardness, weaker strength, and weaker adhesion on the wafer surface. This is followed by mechanical material removal through the relative motion between the polishing pad, abrasive, and the wafer. The key to achieving efficient material removal and an undamaged ultra-smooth surface in CMP lies in balancing the chemical and mechanical actions effectively.

Currently, CMP typically employs highly corrosive polishing liquids, such as hydrofluoric acid, hydrogen peroxide, potassium hydroxide, and potassium permanganate, to chemically etch the SiC wafer surface. However, these strong acidic and alkaline solutions can also corrode the polishing equipment and polishing pad, requiring regular maintenance of corroded equipment and periodic replacement of polishing pad, which increases additional maintenance costs. Moreover, these waste polishing liquids with strong acidic and alkaline solutions may pollute the environment, necessitating treatment of the waste polishing liquids.

Metallic contact corrosion can generate corrosion currents on the surfaces of metal and contact materials, leading to the formation of highly oxidative holes that corrode the workpiece surface. Currently, there are few studies in China on generating corrosion currents from metal particles and contact materials to achieve corrosion polishing.

A Chinese patent (CN114559302B) disclosed a polishing liquid in which metal powders are injected onto the surface of the polishing pad through the polishing liquid. The polishing liquid flows, and after processing, the metal powders becomes part of the waste slurry as the polishing liquid moves, resulting in metal powder waste. Furthermore, the metal powders in this solution do not solidify on the polishing pad and flow with the polishing liquid. The influence of the magnetic field on the pad hardness and its effect on the particles is minimal, meaning the magnetic field cannot control the force exerted by the abrasive on the workpiece surface. As a result, the mechanical removal force of the polishing pad and abrasive increases, while the chemical reaction by the metal powders on the workpiece surface remains relatively unchanged, leading to an imbalance between chemical action and mechanical removal force, which prevents efficient material removal.

Magnetorheological elastic polishing pad offers advantages of mechanical controll and mechanical removal. For example, a Chinese patent (CN113770816B) discloses a magnetorheological elastomer, preparation method and application thereof, using the elastomer as a polishing pad in chemical mechanical polishing, with the magnetic field controlling the mechanical removal process. Another patent (CN116833900A) discloses a magnetorheological elastic pad for semiconductor wafer CMP and its application. In this magnetorheological elastic pad, magnetic particles (CIP@Fe$_3$O$_4$) can undergo a Fenton reaction under an action of hydrogen peroxide polishing liquid, generating highly oxidative hydroxyl radicals to oxidize the surface of semiconductor workpieces. However, the strong oxidative action of hydroxyl radicals and the oxidation from hydrogen peroxide are not selective, which can lead to corrosion of the polishing liquid, equipment, polishing pads, etc., increasing additional costs.

In summary, there is rarely detailed research on how to combine magnetorheological elastic polishing pad with metal contact corrosion to form a polishing pad that avoids metal powder waste, or how to better control the force exerted by the magnetic field on abrasive and their effect on the workpiece surface.

SUMMARY

The present disclosure provides a method for chemical mechanical polishing of a SiC wafer based on a magnetorheological elastic metal contact corrosion polishing pad. The technical problem that the present disclosure aims to solve is to overcome the issues of waste of polishing liquid and uncontrollable chemical mechanical effects in metal contact corrosion polishing, as well as to address the corrosion of equipment and polishing pads caused by the highly oxidative polishing liquids in magnetorheological polishing.

The magnetorheological elastic metal contact corrosion polishing pad provided in the present disclosure can control the hardness of the polishing pad via an external magnetic field. This allows control of the chemical corrosion of metal in the polishing pad on a SiC wafer in an electrolyte solution, and the mechanical removal of the corrosion layer on the SiC wafer surface by abrasive in the polishing pad, achieving a balance between chemical and mechanical effects for efficient material removal and obtaining high-quality SiC wafer surfaces.

In view of the above technical issues, the object of the present disclosure is to provide a magnetorheological elastic metal contact corrosion polishing pad, which is applied in chemical mechanical polishing of a SiC wafer.

The magnetorheological elastic metal contact corrosion polishing pad for chemical mechanical polishing of a SiC wafer, includes the following raw materials:
  silicone oil: 6 to 20 wt %; and
  polyurethane prepolymer: 20 to 50 wt %; and
  chain extender crosslinking agent: 1 to 3 wt %; and
  catalyst: 0.001 to 0.1 wt %; and
  the metal powders: 5 to 30 wt %; and
  magnetic particles: 10 to 60 wt %; and
  the abrasive: 2 to 10 wt %; and
  hollow microspheres: 0.5 to 2 wt %.

The silicone oil is hydroxypropyl silicone oil. Under an action of the catalyst and the chain extender crosslinking agent, the hydroxypropyl silicone oil and the polyurethane prepolymer form a base material of the magnetorheological elastic metal contact corrosion polishing pad, and the magnetic particles form a magnetic string during a preparation process; and the abrasive, the metal powders, and the hollow microspheres are uniformly distributed in the surfaces of the magnetic string.

In the present disclosure, the silicone oil, the polyurethane prepolymer, the catalyst, and the chain extender crosslinking agent are chemically reacted, to form the elastic matrix in the magnetorheological elastic metal contact corrosion polishing pad. Active groups in the silicone oil can co-polymerize with the active groups in the polyurethane prepolymer and chain extender crosslinking agent, forming a crosslinked polymer with an interpenetrating structure. Chemical bonds in the elastic matrix have excellent water resistance, making it difficult for the polishing pad to glaze during the SiC wafer polishing process, maintaining a certain surface roughness and offering a longer service life without requiring online surface reconditioning.

The magnetic particles in the magnetorheological elastic metal contact corrosion polishing pad form the chain string under the applied curing magnetic field during a curing process. The metal powders, the abrasive, and the hollow microspheres are held in the chain structure and dispersed freely. After a vulcanization process, chain string of the magnetic particles, the metal powders, the abrasive, and the hollow microspheres are completely encapsulated by the base material.

The magnetic particles in the magnetorheological elastic metal contact corrosion polishing pad are typically carbonyl iron powders, which have the best saturation magnetization and allow maximum control of the polishing pad's mechanical properties through an external magnetic field during the polishing process. This helps control the chemical corrosion of the metal on the SiC wafer and the mechanical removal of the corrosion layer on the SiC wafer surface by the abrasive. A preferred particle size of the carbonyl iron powders is 1 to 10 μm, more preferably 3 to 5 μm, for better chain string formation. A preferred mass fraction of the carbonyl iron powders is 40 to 60 wt %.

The metal powders in the magnetorheological elastic metal contact corrosion polishing pad can undergo contact corrosion in the electrolyte solution, such as aluminum powders, copper powders, or iron powders. More preferably, metal of the metal powders has a large work function, as the higher work function results in a stronger contact corrosion reaction. Aluminum powders is preferred. A preferred particle size of the metal powders is 0.1 to 3 μm, more preferably 0.2 to 1 μm, with a mass fraction of 5 to 15 wt %.

The hollow microspheres in the magnetorheological elastic metal contact corrosion polishing pad are dispersed in the matrix during the preparation process. During the vulcanization process, the hollow microspheres break and form pores, and the pores are configured to store and transport polishing liquid, maintaining the required polishing environment during the polishing process.

The silicone oil is a reactive silicone oil, preferably either hydroxy silicone oil or hydroxypropyl silicone oil. A molecular weight of the silicone oil represents the length of chain segments; the larger the molecular weight, the longer the chain segments. As the molecular weight increases, the proportion of reactive groups at both ends of the chain segments decreases, making it more difficult to react with the isocyanate groups in the polyurethane prepolymer. The molecular weight of the silicone oil is 500 to 5000 g/mol, with a reactive group content of 2% to 10%. The molecular weight of the silicone oil is similar in the molecular weight of the soft segments of the polyurethane prepolymer, avoiding the problem of micro-phase separation caused by a large molecular weight difference.

The polyurethane prepolymer has reactive groups, preferably the polyurethane prepolymer is terminal isocyanate group prepolymer or terminal hydroxyl group prepolymer, which connect the polyurethane segments to the silicone oil segments.

The metal powders are aluminum powders or aluminum-containing composite powders, with a particle size of 0.1 to 20 μm. The aluminum-containing composite powders contains a substantial amount of aluminum, which accounts for at least 80%, with other elements selected according to different application scenarios, such as iron, silicon, copper, magnesium, manganese, etc. The aluminum in the alloy plays a main role, while the other elements can enhance the chemical reaction process.

The abrasive is selected from one of diamond, alumina, silicon carbide, silica, or ceria, with a particle size of 0.1 to 5 μm and a preferred mass fraction is 5 to 10 wt %.

The present disclosure also provides a preparation method of the magnetorheological elastic metal contact corrosion polishing pad for SiC wafer chemical mechanical polishing, the preparation method includes the following steps:

S1: performing an ultrasonic mechanical stirring on the raw materials in a specified weight fractions at 60 to 90° C. for 5 to 15 minutes to obtain a first mixture, wherein the raw materials includes silicone oil, polyurethane prepolymer, catalyst, hollow microspheres, magnetic particles, and metal powders; and S2: adding the chain extender crosslinking agent to the first mixture and stirring for 1 to 5 minutes, and then performing a vacuum process to obtain a second mixture, pouring the second mixture into a mold; and S3: applying a magnetic field to the mold, to allow the magnetic particles form a magnetic string; and performing a vulcanization process on the magnetic string at 100 to 120° C. for 10 to 20 hours to obtain the magnetorheological elastic metal contact corrosion polishing pad for SiC wafer chemical mechanical polishing.

The present disclosure also provide a method for chemical mechanical polishing of a SiC wafer based on a magnetorheological elastic metal contact corrosion polishing pad, the method includes the following steps of SS1 to SS3.

SS1: Attaching a magnetorheological elastic metal contact corrosion polishing pad to a polishing disk, leading a SiC wafer and the magnetorheological elastic metal contact corrosion polishing pad to contact and move relative to each other. That is, attaching the magnetorheological elastic metal contact corrosion polishing pad to the polishing disk, and attaching the SiC wafer to the workpiece disk; applying a polishing pressure for contacting, allowing a relative motion between a polishing pad revolution and a SiC wafer rotate.

SS2: Adding an electrolyte solution with a concentration of 0.5 to 5 mol/L onto the magnetorheological elastic metal contact corrosion polishing pad; wherein electrolyte solution is non-corrosive, the solution is between the SiC wafer and the magnetorheological elastic metal contact corrosion polishing pad. That is, using a delivery device to add the electrolyte solution onto the magnetorheological elastic metal contact corrosion polishing pad. Holes are defined on the magnetorheological elastic metal contact corrosion polishing pad, and the holes are configured to store and transport the electrolyte solution. The metal particles in the polishing pad undergoes contact corrosion with the SiC wafer in the electrolyte solution, and the corrosion current is transmitted to the SiC wafer's surface, causing a separation of electrons and holes on the SiC wafer surface, with more holes gathering on the SiC wafer's surface, generating a corrosion layer.

SS3: Applying a polishing magnetic field to the magnetorheological elastic metal contact corrosion polishing pad to control the contact state of the abrasive and metal powders on the SiC wafer, wherein an intensity of the polishing magnetic field is 0 to 800 mT. To achieve a control over a chemical reaction intensity of the metal powders on a SiC wafer surface in the electrolyte solution. And to achieve a mechanical removal of materials from the SiC wafer surface via the abrasive. That is, applying the polishing magnetic field to the magnetorheological elastic metal contact corrosion polishing pad from the polishing disk, controlling the polishing magnetic field strength to 0 to 800 mT to adjust the changes in the magnetorheological elastic metal contact corrosion polishing pad's elastic modulus and other mechanical properties, thereby controlling a contact number and force of the metal particles on the SiC wafer's surface, influencing the chemical reaction intensity of the metal on the SiC wafer surface. Similarly, the polishing magnetic field can control the contact number and force of the abrasive on the SiC wafer surface, thus affecting the mechanical removal of material from the SiC wafer.

In the electrolyte solution, a contact corrosion is occurred between the metal powders and the SiC wafer surface, generating a soft, weakly bonded oxide layer. The oxide layer is removed by the mechanical removal, under the control of the polishing magnetic field, mechanically removes the oxide layer, achieving efficient material removal and obtaining a high-quality surface.

Furthermore, the electrolyte solution has good electrical conductivity. The higher the conductivity, the stronger the ability to conduct corrosion currents and the stronger the chemical reaction, leading to a thicker corrosion layer. The electrolyte solution does not include strongly corrosive strong acid and strong alkali solutions, as such solutions would severely corrode the equipment and magnetorheological elastic metal contact corrosion polishing pad. The electrolyte solution is a salt-based solution, such as sodium sulfate or potassium chloride, and the sodium sulfate is preferred.

Furthermore, the polishing magnetic field strength is in the range of 0 to 800 mT. The greater the magnetic field strength, the stronger the interaction force between the magnetic particles in the polishing pad, resulting in a higher elastic modulus of the polishing pad. This leads to more contact between the SiC wafer surface and the metal powders and abrasive, which induces stronger metal contact corrosion reactions. At the same time, the abrasive causes greater material removal from the corrosion layer on the SiC wafer surface. By adjusting the polishing magnetic field strength, the magnetorheological elastic metal contact corrosion polishing pad can achieve a balance between the chemical and mechanical effects in the chemical mechanical polishing of the SiC wafer, enabling efficient material removal and obtaining a high-quality surface.

Furthermore, the chemical contact corrosion reaction process of the magnetorheological elastic metal contact corrosion polishing pad on the SiC wafer surface, using aluminum as an example, the chemical reaction equations of the chemical contact corrosion reaction process as follows:

$2H_2O+O_2+4e^-=4OH^-$; and $\frac{1}{2}O_2 + H_2O + 2e^- = 2 OH^-$;

and $OH_{ads}+e^-=OH^-$; and $Al=Al^{3+}+3e^-$; and $2Al(OH)_{3,ads}=Al_2O_3 \square 3H_2O$; and $Al(s)+3OH^- \rightarrow Al(OH)_{3,ads}+3e^-$; and $SiC+2H_2O+8h^+ \rightarrow SiO_2+4H^++CO_2$; and $H_2O+2e^- \rightarrow H_2+OH^-$; and $Al_2O_3+H_2O \rightarrow 2AlOOH$; and $2AlOOH+2SiO_2 \rightarrow Al_2Si_2O_5 \square H_2O$.

Furthermore, in chemical reaction equation $SiC+2H_2O+8h^+ \rightarrow SiO_2+4H^++CO_2$, the semiconductor SiC wafer can be oxidized by holes (h+). During the contact corrosion process of metal powders of the polishing pad's on the SiC wafer surface in the electrolyte solution, the corrosion current flows toward the SiC wafer surface, causing electron-hole separation on the SiC wafer surface. The highly oxidative holes lead to the oxidation of the SiC wafer surface, forming a $SiO_2$ oxide layer with lower hardness and weaker adhesion. The $SiO_2$ oxide layer is then efficiently removed from the SiC wafer surface by the mechanical action of the abrasive.

Compared with the prior arts, the beneficial effects of the present disclosure are as follows.

(1) The magnetorheological elastic metal contact corrosion polishing pad provided by the present disclosure consolidates metal powders in the polishing pad. The metal powders can cause contact corrosion on the SiC wafer surface in a non-corrosive electrolyte solution. The highly oxidative holes oxidize the SiC wafer surface into a softer $SiO_2$ oxide layer with lower hardness and weaker bonding. The abrasive then mechanically removes this oxide layer, achieving efficient material removal from the SiC wafer surface. The method for chemical mechanical polishing of the SiC wafer based on the magnetorheological elastic metal contact corrosion polishing pad results in highly oxidative holes only affecting the SiC wafer surface, making it environmentally friendly and reducing subsequent equipment maintenance and polishing waste liquid disposal costs.

(3) When the magnetorheological elastic metal contact corrosion polishing pad is applied to SiC wafer polishing, the polishing magnetic field can control the strength of the chemical corrosion reaction of the metal contact, while also controlling the strength of the abrasive's mechanical material removal action on the SiC wafer surface. This enables a balance between the chemical and mechanical effects in chemical mechanical polishing, allowing for simultaneous coarse and fine polishing, reducing processing steps, improving processing efficiency, and achieving a high-quality processed surface.

DESCRIPTION OF THE REFERENCE NUMERAL

Figure 1:
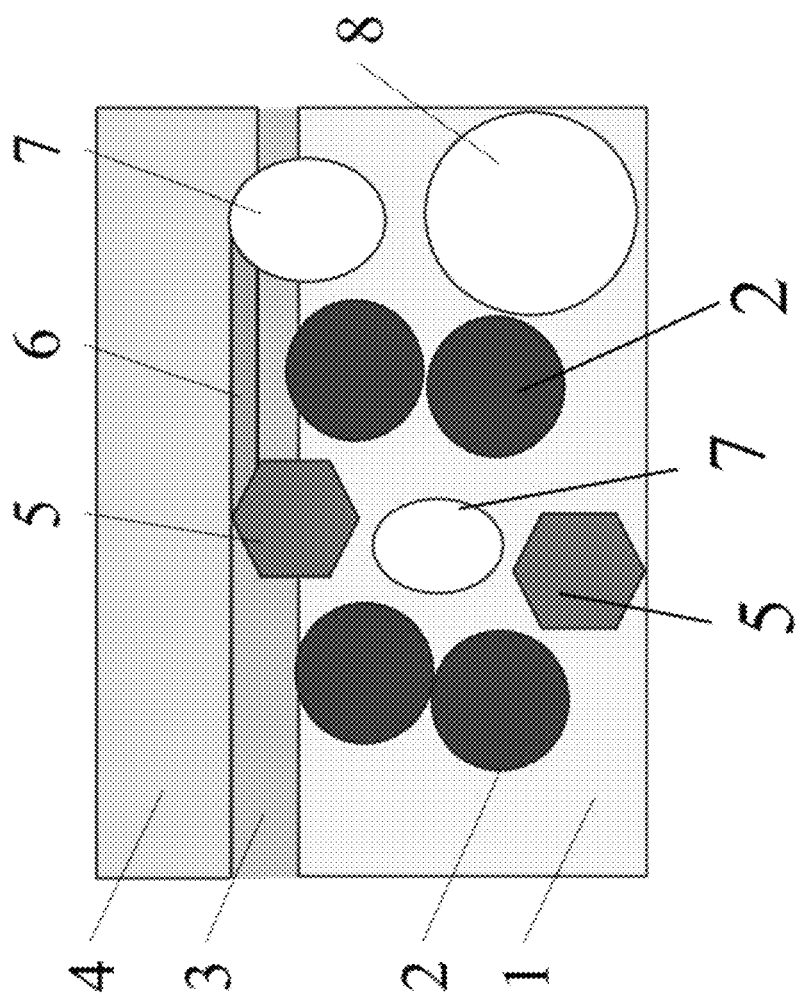
FIG. 1 is a schematic structural diagram of a magnetorheological elastic metal contact corrosion polishing pad and a SiC wafer according to an embodiment of the present disclosure.

1 magnetorheological elastic matrix, 2 magnetic particle, 3 electrolyte solution, 4 SiC wafer, 5 abrasive, 6 corrosion layer, 7 metal powder, 8 hole.

DETAILED DESCRIPTION OF THE EMBODIMENTS

The technical solutions in the embodiments of the present disclosure will be described clearly and completely with reference to the accompanying drawings in the embodiments of the present disclosure. Obviously, the described embodiments are only a part of the embodiments of the present disclosure rather than all of them. Based on the embodiments in the present disclosure, all other embodiments obtained by those skilled in the art without creative work shall fall within the scope of protection of the present disclosure.

With the reference of FIG. 1 to FIG. 4, herein embodiments of the present disclosure are proposed.

Embodiment 1 to Embodiment 5

Embodiment 1 to embodiment 5 of the present disclosure provides magnetorheological elastic metal contact corrosion polishing pads with different contents of raw materials and different polishing parameter. The raw materials includes silicone oil, polyurethane prepolymer, chain extender crosslinking agent, catalyst, metal powders, magnetic particles, abrasive and hollow microspheres. And the contents of each raw material and the polishing parameters of the embodiment 1 to embodiment 5 are shown in table 1.

TABLE 1

Contents of each raw material and the polishing parameters of the embodiment 1 to embodiment 5

|  |  | Embodiments | | | | |
|---|---|---|---|---|---|---|
|  | Raw materials | 1 | 2 | 3 | 4 | 5 |
| Contents | metal powders | 15 | 0 | 0 | 15 | 15 |
|  | magnetic particles | 40 | 40 | 40 | 40 | 40 |
|  | abrasive | 15 | 30 | 30 | 15 | 15 |
|  | hydroxy silicone oil | 11.5 | 11.5 | 11.5 | 11.5 | 11.5 |
|  | Polyurethane prepolymer | 27 | 27 | 27 | 27 | 27 |
|  | chain extender crosslinking agent | 1.5 | 1.5 | 1.5 | 1.5 | 1.5 |
|  | catalyst | 0.001 | 0.001 | 0.001 | 0.001 | 0.001 |
|  | hollow microspheres | 0.1 | 0.1 | 0.1 | 0.1 | 0.1 |
| Polishing parameters | Sodium sulfate solution (mol/L) | 1.25 | 1.25 | 0 | 0 | 1.25 |
|  | Intensity of polishing magnetic field (mT) | 380 | 380 | 380 | 380 | 0 |

Wherein, the metal powders are aluminum powders with an average particle size of 500 nm. The magnetic particles are carbonyl iron powder (CIP) with an average particle size of 3 μm; the abrasive is silica with an average particle size of 200 nm; the hydroxypropyl siloxane has a molecular weight of 2000 g/mol and a hydroxyl value of 61. The polyurethane prepolymer is poly(tetramethylene glycol) (PTMG)/toluene diisocyanate (TDI), the PTMG-TDI is prepared by solution polymerization method, using PTMG as the soft segment and TDI as the hard segment. The chain extender crosslinker is 4,4'-diamino-3,3'-dichlorodiphenylmethane (MOCA). The catalyst is stannous octoate. The hollow microspheres are FA-30DE microspheres with a particle size of 20 μm.

In the embodiment 3 and embodiment 4, the polishing parameters for sodium sulfate solution is 0, indicating that no sodium sulfate electrolyte is added in this two embodiments, and only deionized water is directly added.

In the embodiment 5, the polishing parameter for intensity of the magnetic field strength is 0, indicating that no polishing magnetic field is applied.

The magnetorheological elastic metal contact corrosion polishing pad is prepared by the following steps:

S1: performing an ultrasonic mechanical stirring on raw materials in a specified weight fraction at 70° C. for 10 minutes to obtain a first mixture, wherein the raw materials includes the metal powders, the magnetic particles, the abrasive, the hydroxypropyl silicone oil, the polyurethane prepolymer of PTMG/TDI, catalyst stannous octanoate, and the hollow microspheres, S2: adding the chain extender crosslinking agent to the first mixture and stirring at a speed of 1500 r/min for 1 minute at 70° C., and then performing a vacuum process in a vacuum drying oven for defoaming treatment to obtain a second mixture, pouring the second mixture into a mold; and S3: applying a parallel magnetic field to the mold, to allow the magnetic particles form a magnetic string, an intensity of the parallel magnetic field is 260 mT; and performing a vulcanization process on the magnetic string at 115° C. for 16 hours to obtain the magnetorheological elastic metal contact corrosion polishing pad for SiC wafer chemical mechanical polishing. The magnetorheological elastic metal contact corrosion polishing pad is anisotropic.

Figure 2:
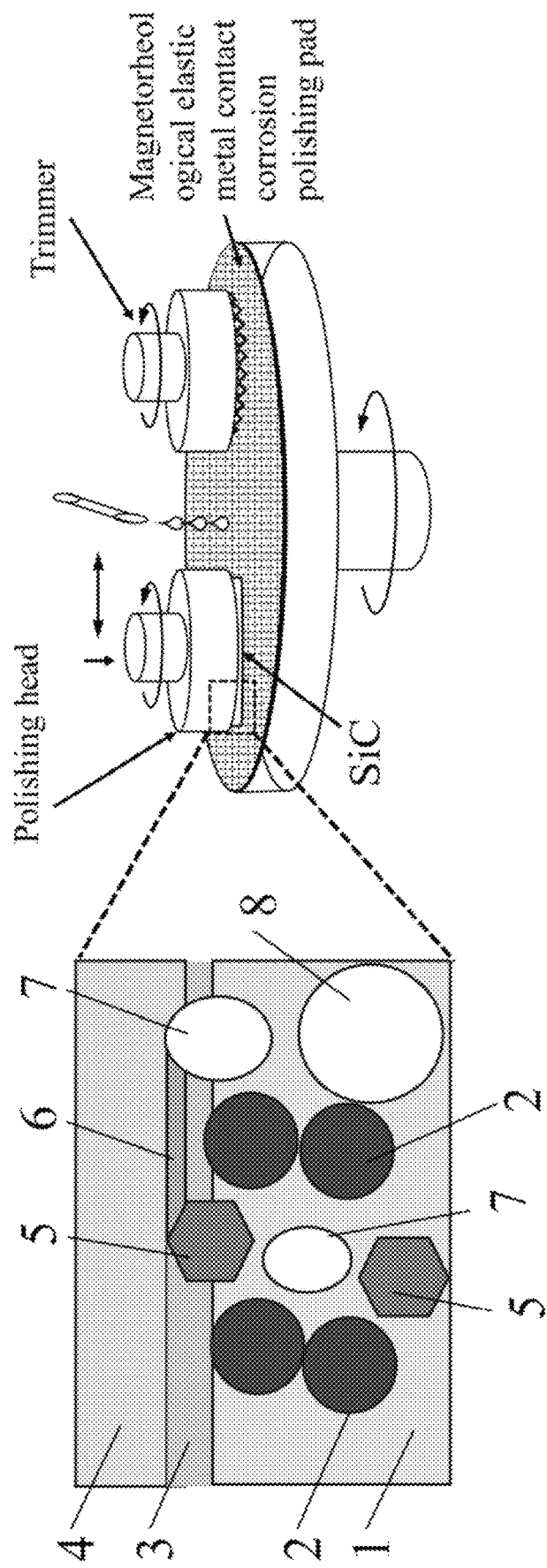
FIG. 2 is a schematic structural diagram of a polishing process and the magnetorheological elastic metal contact corrosion polishing pad and the SiC wafer.
Figure 3:
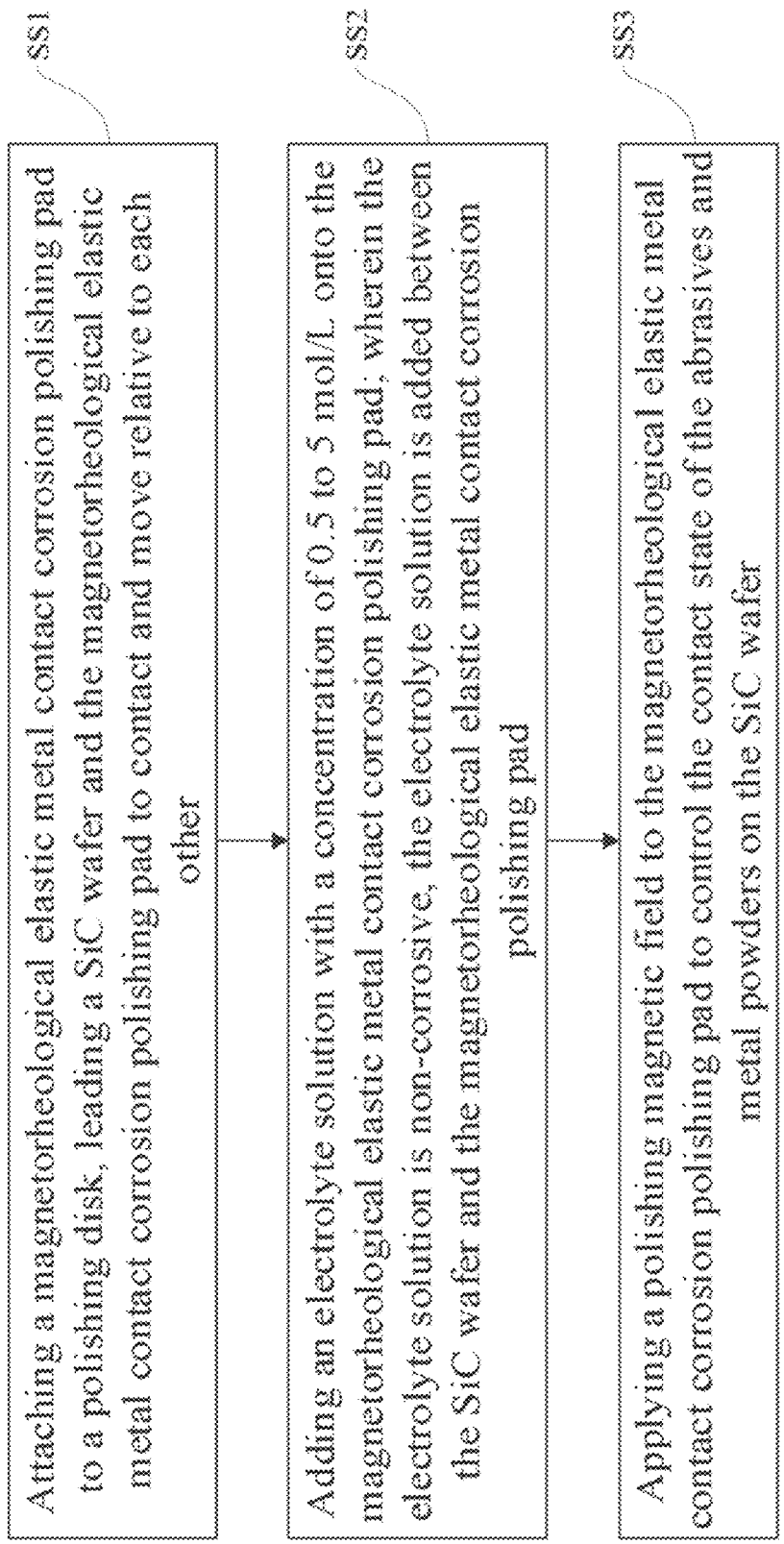
FIG. 3 is a flow chart of the method for chemical mechanical polishing of a SiC wafer based on a magnetorheological elastic metal contact corrosion polishing pad according to an embodiment of the present disclosure.
Figure 4:
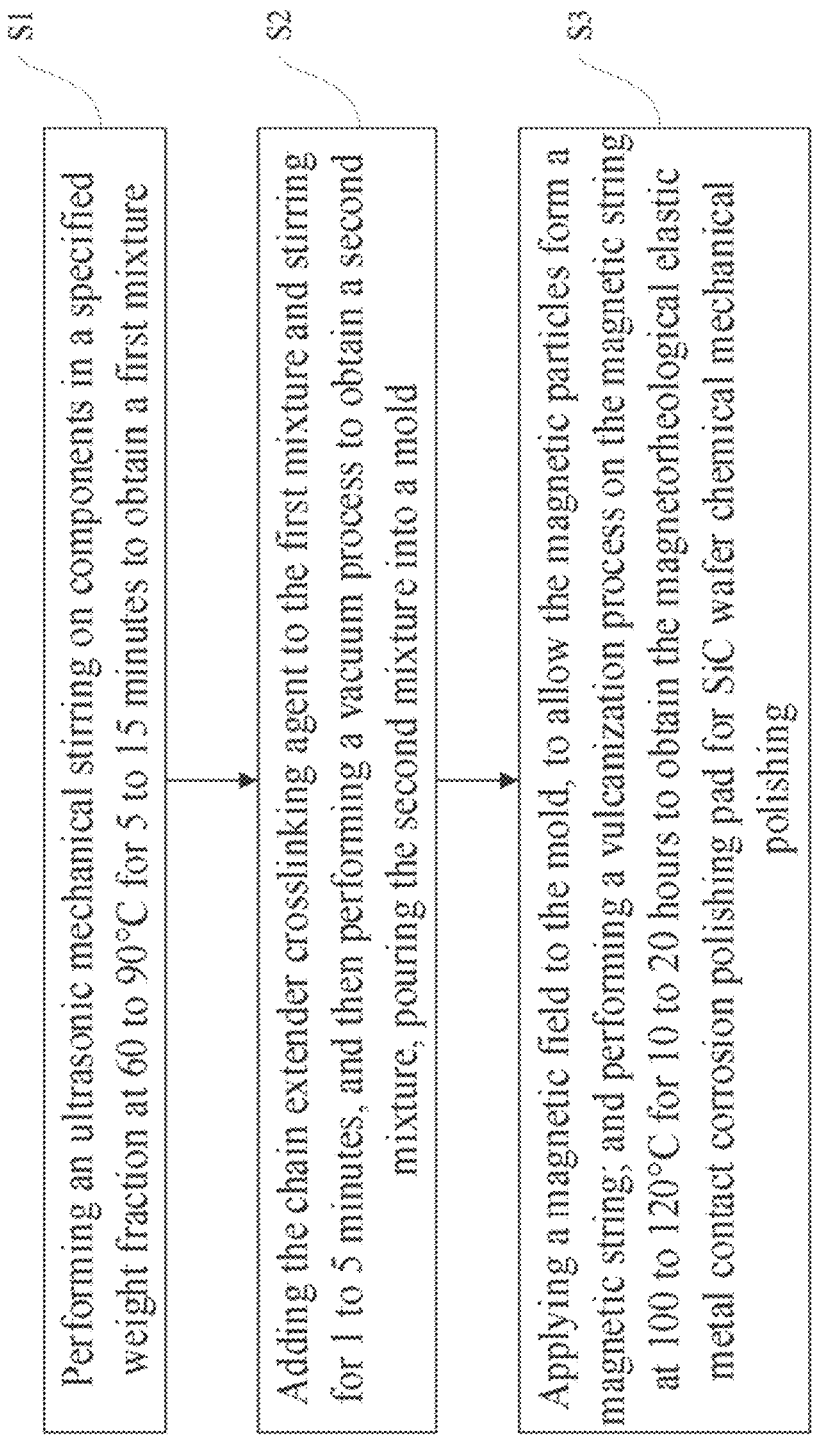
FIG. 4 is a flow chart of a preparation method of a magnetorheological elastic metal contact corrosion polishing pad according to an embodiment of the present disclosure.

The SiC wafer was polished using the magnetorheological elastic metal contact corrosion polishing pads prepared by embodiment 1 to embodiment 5, and the polishing effect of the each magnetorheological elastic metal contact corrosion polishing pad was tested. As shown in FIG. 2, Under a certain magnetic field, the SiC wafer on the polishing head comes into contact with the magnetorheological elastic metal contact corrosion polishing pad and undergoes relative motion. The magnetorheological elastic metal contact corrosion polishing pad causes corrosion on the SiC wafer surface, forming an oxide layer, which is then removed by the abrasive in the electrolyte solution, exposing a fresh SiC wafer surface. This cyclical process enables chemical mechanical material removal. Meanwhile, the trimmer intermittently refurbishes the surface of the magnetorheological elastic metal contact corrosion polishing pad to ensure the effectiveness of chemical corrosion on the SiC wafer surface and to maintain the magnetorheological elastic metal contact corrosion polishing pad's capacity to carry the electrolyte solution.

The SiC wafer is C-face wafer of a 2-inch 4H—SiC, with an initial surface roughness of 2 nm. A polishing time is 1 hour. The change in SiC wafer mass before and after polishing is measured by a precision electronic balance (accuracy: 0.1 mg) to calculate the material removal rate. Surface roughness and morphology changes before and after polishing are measured using a white light interferometer (ContourGT-X3). For each test, measurements are taken at four different positions on a same radius, and the average value is taken. The roughness variation range is expressed by s standard deviation to evaluate the polishing effect. The polishing results are shown in Table 2.

TABLE 2

Polishing results

| Embodiments | Polishing results | |
| --- | --- | --- |
| | material removal rate (nm/h) | Surface roughness (nm) |
| 1 | 823.5 | 0.314 |
| 2 | 634.6 | 0.823 |
| 3 | 648.2 | 0.815 |
| 4 | 584.9 | 0.834 |
| 5 | 673.6 | 0.563 |

From embodiments 2 and 3 in Table 2, it can be seen that the material removal rate and surface roughness differences after polishing with a polishing pad without metal powders and without the addition of an electrolyte solution are minimal, indicating that the electrolyte solution does not have a chemical effect on the polishing pad containing only abrasive. By comparing embodiment 1 and embodiment 2, it can be found that the magnetorheological elastic metal contact corrosion polishing pad with added aluminum powders exhibits a higher material removal rate and lower surface roughness than the magnetorheological polishing pad with only silica abrasive. This indicates that the aluminum powders can generate a corrosion layer on the SiC wafer surface when in contact with the electrolyte solution, and then the abrasive can more easily remove the corrosion layer from the SiC wafer surface, resulting in a higher material removal rate and lower surface roughness. Furthermore, although the magnetorheological elastic polishing pad in embodiment 2 contains 30 wt % silica abrasive, the silica abrasive has difficulty mechanically removing SiC surface material directly. In contrast, embodiment 1, despite containing only 15 wt % abrasive, benefits from the addition of 15 wt % aluminum powders, which generate a corrosion layer on the SiC wafer surface that can be quickly removed under the mechanical action of the abrasive, resulting in a higher material removal rate.

By comparing embodiment 1 and embodiment 4, it can be seen that applying the magnetorheological elastic metal contact corrosion polishing pad to the polishing of SiC wafer with the addition of the electrolyte solution increased the material removal rate by 40.8% and reduced the surface roughness by 62.4%. This demonstrates that the addition of sodium sulfate electrolyte solution allows the metal powders in the polishing pad to chemically corrode the SiC wafer surface, while the metal contact corrosion process in deionized water is much weaker. Further optimization of the electrolyte solution parameters can enhance the metal contact corrosion chemical reaction and improve processing efficiency.

By comparing embodiment 1 and embodiment 5, it can be seen that applying a polishing magnetic field to the magnetorheological elastic metal contact corrosion polishing pad significantly increases the material removal rate. The material removal efficiency after applying the magnetic field increased by 22.3%. These results indicate that applying a polishing magnetic field can, on one hand, increase the hardness of the magnetorheological elastic metal contact corrosion, resulting in a stronger mechanical action of the polishing pad and the material removal of the abrasive on the SiC surface; on the other hand, applying the polishing magnetic field increases the contact force between the aluminum metal on the polishing pad and the SiC surface, enhancing the metal contact corrosion. Under the interaction of chemical and mechanical forces, greater material removal can be achieved.

The magnetorheological elastic metal contact corrosion polishing pad of the present disclosure has magnetic field-controlled chemical reactions for metal contact corrosion, which demonstrates that the polishing pad can achieve better polishing results while offering the advantage of environmentally friendly polishing cost control.

Those skilled in the art will recognize that the embodiments and comparisons presented here are intended to illustrate that the magnetorheological elastic metal contact corrosion polishing pad simultaneously achieves magnetic-controlled chemical polishing. They are meant to help readers understand the advantages of the present disclosure, and the scope of the disclosure is not limited to these specific statements and embodiments. Ordinary skilled persons in the field can make various other preparation processes and polishing parameter adjustments based on the technical disclosures of this disclosure, and these will still fall within the scope of the present disclosure.

What is claimed is:

1. A method for chemical mechanical polishing of a SiC wafer based on a magnetorheological elastic metal contact corrosion polishing pad, wherein, comprising following steps of:
   SS1: attaching a magnetorheological elastic metal contact corrosion polishing pad to a polishing disk, leading a SiC wafer and the magnetorheological elastic metal contact corrosion polishing pad to contact and move relative to each other;
   SS2: adding an electrolyte solution with a concentration of 0.5 to 5 mol/L onto the magnetorheological elastic metal contact corrosion polishing pad; wherein the electrolyte solution is non-corrosive, the electrolyte solution is added between the SiC wafer and the magnetorheological elastic metal contact corrosion polishing pad;

SS3: applying a polishing magnetic field to the magnetorheological elastic metal contact corrosion polishing pad to control the contact state of the abrasive and metal powders on the SiC wafer, wherein an intensity of the polishing magnetic field is 0 to 800 mT; to achieve a control over a chemical reaction intensity of the metal powders on a SiC wafer surface in the electrolyte solution, and to achieve a mechanical removal of materials from the SiC wafer surface via the abrasive; in the electrolyte solution, a contact corrosion is occurred between the metal powders and the SiC wafer surface, generating an oxide layer; and the oxide layer is removed by the mechanical removal, and the mechanical removal is achieved by the abrasive, achieving material removal and obtaining a polished surface;

wherein, the magnetorheological elastic metal contact corrosion polishing pad comprises the following raw materials:

silicone oil: 6 to 20 wt %; and polyurethane prepolymer: 20 to 50 wt %; and chain extender crosslinking agent: 1 to 3 wt %; and catalyst: 0.001 to 0.1 wt %; and the metal powders: 5 to 30 wt %; and magnetic particles: 10 to 60 wt %; and the abrasive: 2 to 10 wt %; and hollow microspheres: 0.5 to 2 wt %;

wherein the silicone oil is one of hydroxy silicone oil or hydroxypropyl silicone oil, a molecular weight of the silicone oil is 500 to 5000 g/mol, a reactive group content is 2% to 10%;

under an action of the catalyst and the chain extender crosslinking agent, the hydroxypropyl silicone oil and the polyurethane prepolymer form a base material of the magnetorheological elastic metal contact corrosion polishing pad, and the magnetic particles form a magnetic string during a preparation process; and the abrasive, the metal powders, and the hollow microspheres are uniformly distributed in the surfaces of the magnetic string.

2. The method for chemical mechanical polishing of the SiC wafer based on the magnetorheological elastic metal contact corrosion polishing pad according to claim 1, wherein, the polyurethane prepolymer is terminal isocyanate group prepolymer or terminal hydroxyl group prepolymer.

3. The method for chemical mechanical polishing of the SiC wafer based on the magnetorheological elastic metal contact corrosion polishing pad according to claim 1, wherein, the metal powders are aluminum powders or aluminum-containing composite powders, and a particle size is 0.1 to 20 μm.

4. The method for chemical mechanical polishing of the SiC wafer based on the magnetorheological elastic metal contact corrosion polishing pad according to claim 1, wherein, abrasive are selected from one of diamond, alumina, silicon carbide, silica, or ceria; a particle size of the abrasive is 0.1 to 5 μm.

5. The method for chemical mechanical polishing of the SiC wafer based on the magnetorheological elastic metal contact corrosion polishing pad according to claim 1, wherein, the magnetorheological elastic metal contact corrosion polishing pad is prepared by the following steps:

S1: performing an ultrasonic mechanical stirring on raw materials in a specified weight fraction at 60 to 90° C. for 5 to 15 minutes to obtain a first mixture, wherein the raw materials comprises silicone oil, polyurethane prepolymer, catalyst, hollow microspheres, magnetic particles, and metal powders; and S2: adding the chain extender crosslinking agent to the first mixture and stirring for 1 to 5 minutes, and then performing a vacuum process to obtain a second mixture, pouring the second mixture into a mold; and S3: applying a magnetic field to the mold, to allow the magnetic particles form a magnetic string; and performing a vulcanization process on the magnetic string at 100 to 120° C. for 10 to 20 hours to obtain the magnetorheological elastic metal contact corrosion polishing pad for SiC wafer chemical mechanical polishing.

* * * * *